United States Patent
Liu et al.

(10) Patent No.: US 9,097,780 B2
(45) Date of Patent: Aug. 4, 2015

(54) MULTI-STAGE MAGNETIC RESONANCE RECONSTRUCTION FOR PARALLEL IMAGING APPLICATIONS

(71) Applicants: Jun Liu, Cary, NC (US); Zhili Yang, West Windsor, NJ (US); Mariappan S. Nadar, Plainsboro, NJ (US); Nirmal Janardhanan, Plainsboro, NJ (US); Michael Zenge, Nuremberg (DE); Edgar Mueller, Heroldsbach (DE); Qiu Wang, Princeton, NJ (US); Axel Loewe, Karlsruhe (DE)

(72) Inventors: Jun Liu, Cary, NC (US); Zhili Yang, West Windsor, NJ (US); Mariappan S. Nadar, Plainsboro, NJ (US); Nirmal Janardhanan, Plainsboro, NJ (US); Michael Zenge, Nuremberg (DE); Edgar Mueller, Heroldsbach (DE); Qiu Wang, Princeton, NJ (US); Axel Loewe, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 80 days.

(21) Appl. No.: 14/054,003

(22) Filed: Oct. 15, 2013

(65) Prior Publication Data
US 2014/0133724 A1 May 15, 2014

Related U.S. Application Data

(60) Provisional application No. 61/724,470, filed on Nov. 9, 2012.

(51) Int. Cl.
*G06K 9/00* (2006.01)
*G01R 33/561* (2006.01)

(52) U.S. Cl.
CPC ............... *G01R 33/5611* (2013.01)

(58) Field of Classification Search
None
See application file for complete search history.

(56) References Cited

U.S. PATENT DOCUMENTS

| | | | |
|---|---|---|---|
| 2011/0286648 A1* | 11/2011 | Sharif et al. | 382/131 |
| 2012/0092009 A1* | 4/2012 | Zhang et al. | 324/309 |
| 2013/0099786 A1* | 4/2013 | Huang et al. | 324/309 |

OTHER PUBLICATIONS

Michael Lustig, David Donoho, and John M. Pauly "Sparse MRI: The Application of Compressed Sensing for Rapid MR Imaging", 2008, Magnetic Resonance in Medicine.*
Mark A. Griswold, Peter M. Jakob, Robin M. Heidemann, Mathis Nittka, Vladimir Jellus, Jianmin Wang, Berthold Keifer, and Axel Haase "Generalized Autocalibrating Partially Parallel Acquisitions (GRAPPA)", 2002, Wiley-Liss, Inc., pp. 1202-1210.*

* cited by examiner

*Primary Examiner* — Siamak Harandi

(57) ABSTRACT

A computer-implemented method for reconstruction of a magnetic resonance image includes acquiring a first incomplete k-space data set comprising a plurality of first k-space lines spaced according to an acceleration factor and one or more calibration lines. A parallel imaging reconstruction technique is applied to the first incomplete k-space data to determine a plurality of second k-space lines not included in the first incomplete k-space data set, thereby yielding a second incomplete k-space data set. Then, the parallel imaging reconstruction technique is applied to the second incomplete k-space data to determine a plurality of third k-space lines not included in the second incomplete k-space data, thereby yielding a complete k-space data set.

20 Claims, 5 Drawing Sheets

US 9,097,780 B2

MULTI-STAGE MAGNETIC RESONANCE RECONSTRUCTION FOR PARALLEL IMAGING APPLICATIONS

This application claims priority to U.S. provisional application Ser. No. 61/724,470 filed Nov. 9, 2012 which is incorporated herein by reference in its entirety.

TECHNICAL FIELD

The present invention relates generally to methods, systems, and apparatuses for interpolating k-space data in magnetic resonance applications where k-space data is highly undersampled (e.g., where a high acceleration factor is employed). The disclosed methods, systems, and apparatuses may be applied to, for example, clinical applications such as lung and abdominal MRI, real-time imaging, and single-shot EPI.

BACKGROUND

The term scan time, as used in the context of Magnetic Resonance Imaging (MRI), refers to the time required to acquire the k-space data needed to produce an image. In many MRI applications, it is beneficial to minimize scan time. For example, if the scan time can be reduced enough, images can be acquired in a single breath-hold which, in turn, will reduce effects such as motion blurring in the acquired image. Additionally, reducing the scan time increases the overall efficiency of the clinician, as well as the scanning device itself. That is, if each scan can be performed faster, then more patients can be scanned by the clinician in a given amount of time.

One approach to reducing the scan time is to undersample the k-space below the Nyquist sampling rate. If fewer lines are acquired during each scan, the overall time required to complete a scan can be proportionally reduced. In order to reduce the total number of lines acquired during each scan, lines are skipped. The number of lines skipped during each scan is characterized by a MRI device setting referred to as the acceleration factor. For example, if the acceleration factor is set to be 2, every other line of k-space data will be acquired. Similarly, if the acceleration factor is 4, every fourth line will be acquired. Although increasing the acceleration factor is generally beneficial in reducing scan time, it results in missing lines of data which must be calculated via interpolation or some other k-space fitting strategy.

Generalized Auto-calibrating Partially Parallel Acquisitions (GRAPPA) is a parallel imaging reconstruction technique that addresses the missing lines of data resulting from increasing the acceleration factor. However, GRAPPA, like any data fitting process, is dependent spacing of the data points used to fit the data. GRAPPA achieves very good image quality when the acceleration factor is set to a low value such as 2. However, in the case of high acceleration factor, image artifacts can be quite visible. More specifically, as the acceleration factor increases, the k-space data becomes increasingly undersampled and more values need to be interpolated with less data. As a result, the overall interpolation error associated with applying the fitting strategy increases. Thus, there is a need for improvements to fitting strategies such as GRAPPA to support high acceleration factors.

SUMMARY

Embodiments of the present invention address and overcome one or more of the above shortcomings and drawbacks by providing methods, systems, and apparatuses for calculating a complete k-space data set using an undersampled k-space data set and a multi-step magnetic resonance reconstruction process. This technology is particularly well-suited for, but by no means limited to, parallel imaging applications such as, lung and abdominal MRI, real-time imaging, and single-shot EPI.

According to some embodiments of the present invention, a computer-implemented method for reconstruction of a magnetic resonance image includes acquiring a first incomplete k-space data set comprising a plurality of first k-space lines spaced according to an acceleration factor and one or more calibration lines. The first k-space data set may comprise, for example, a half field of view (FOV) in a phase encoding direction. In one embodiment, the first incomplete k-space data set is under-sampled every 4 lines. A parallel imaging reconstruction technique such as, for example, Generalized Autocalibrating Partially Parallel Acquisition (GRAPPA) is applied to the first incomplete k-space data to determine a plurality of second k-space lines not included in the first incomplete k-space data set, thereby yielding a second incomplete k-space data set. The second k-space lines may comprise, for example, one or more odd numbered lines between the plurality of first k-space lines. In one embodiment, each second k-space line is located between two first k-space lines.

Next, the parallel imaging reconstruction technique is applied to the second incomplete k-space data to determine a plurality of third k-space lines not included in the second incomplete k-space data, thereby yielding a complete k-space data set. The third k-space lines may comprise, for example, one or more even numbered k-space lines between the plurality of first k-space lines. In one embodiment, wherein each third k-space line is located between a first k-space line and a second k-space line. According to some embodiments, the aforementioned method further includes applying a Fourier transform to the complete k-space data set to yield a reconstructed image. The reconstructed image may then be displayed in a graphical user interface.

According to other embodiments of the present invention, a computer-implemented method for reconstruction of a magnetic resonance image includes acquiring a first incomplete k-space data set comprising a plurality of first k-space lines spaced according to an acceleration factor and one or more calibration lines. Next, a first fitting process is performed. In one embodiment, this first fitting process comprises determining a first linear combination of the first k-space lines providing a first optimal approximation of the one or more calibration lines, and determining a plurality of first coefficient values associated with the first linear combination. Next, the first coefficient values are used to determine a plurality of second k-space lines missing from the first incomplete k-space data set, thereby creating a second incomplete k-space data set. In one embodiment, the plurality of second k-space lines comprise one or more odd numbered lines between the plurality of first k-space lines. Then, a second fitting process is performed. In one embodiment, this second fitting process comprises determining a second linear combination of the first k-space lines and the second k-space lines providing a second optimal approximation of the one or more calibration lines, and determining a plurality of second coefficient values associated with the second linear combination. The second coefficient values are then used to determine a plurality of third k-space lines missing from the second incomplete k-space data set, thereby creating a complete k-space data set. In one embodiment, the plurality of third k-space lines comprise one or more even numbered lines between the plurality of first k-space lines.

In some embodiments, the complete k-space data set comprises a plurality of coil-specific k-space data sets, each coil-specific k-space data set corresponding to one of a plurality of magnetic resonance coils used in acquiring the first incomplete k-space data set. These coil-specific k-space data sets may then be used to produce an image. For example, in one embodiment, a Fourier transform is applied to each coil-specific k-space data sets, to create a plurality of image components. The image components may then be combined into a single image using a combination method such as, for example, a square root sum of squares method.

Other embodiments of the present invention are directed at a system for reconstruction of a magnetic resonance image comprising a plurality of magnetic resonance coils and an image data processor. The magnetic resonance coils are configured to acquire a first incomplete k-space data set comprising a plurality of first k-space lines spaced according to an acceleration factor and one or more calibration lines. The image data processor is configured to apply a parallel imaging reconstruction technique (e.g., GRAPPA) to the first incomplete k-space data to determine a plurality of second k-space lines not included in the first incomplete k-space data, thereby yielding a second incomplete k-space data set. The image data processor is further configured to apply the parallel imaging reconstruction technique to the second incomplete k-space data to determine a plurality of third k-space lines not included in the second incomplete k-space data, thereby yielding a complete k-space data set.

In some embodiments, the complete k-space data set comprises a plurality of coil-specific k-space data sets, each coil-specific k-space data sets corresponding to one of the plurality of magnetic resonance coils. The image data processor may be further configured to applying a Fourier transform to each coil-specific k-space data sets, to create a plurality of image components. The image components may then be combined into a single image using a combination method such as, for example, a square root sum of squares method. The system may further comprise a graphical user interface configured to present the image.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

The following disclosure describes the present invention according to several embodiments directed at methods, systems, and apparatuses for determining a complete k-space data set using an undersampled k-space data set and a multi-step reconstruction process. The invention is particularly well-suited to, but not limited to, applications using parallel MRI acquisition techniques. Additionally, one skilled in the art would recognize that the techniques described herein may be applicable to various domains where incomplete k-space data sets are used in image reconstruction.

Figure 1:
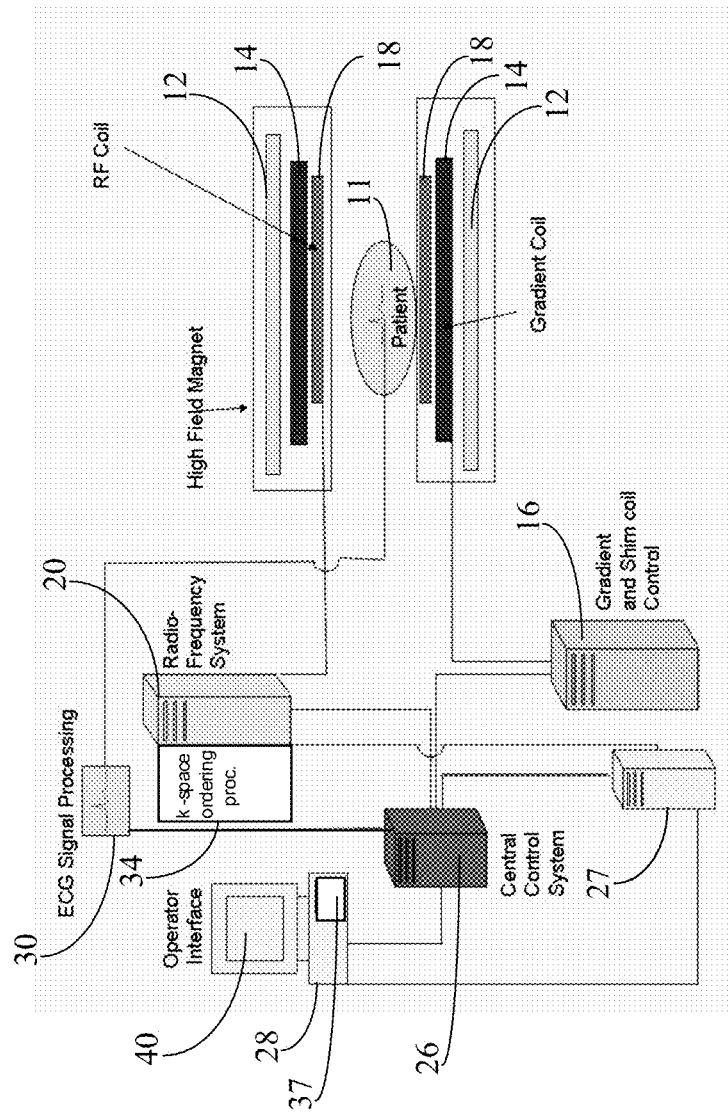
FIG. 1 shows a system for ordering acquisition of frequency domain components representing MR image data for storage in a k-space storage array, according to some embodiments of the present invention.

FIG. 1 shows a system 10 for ordering acquisition of frequency domain components representing MR image data for storage in a k-space storage array, according to some embodiments of the present invention. This system 10 may be used, for example, to acquire an incomplete (e.g., undersampled) k-space data set, as described in various embodiments herein. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming/pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further, radio frequency (RF) system 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16 in conjunction with RF system 20 as directed by central control system 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF system 20 and k-space component processor unit 34 to provide image representative data to an image data processor 27 operably coupled to the central control unit 26. In some embodiments, the image data processor is located within central control unit 26 rather than an external unit, as in FIG. 1. ECG synchronization signal generator 30 provides ECG signals used for pulse sequence and imaging synchronization. A two or three dimensional k-space storage array of individual data elements in unit 34 stores corresponding individual frequency components comprising an MR data set. The k-space array of individual data elements has a designated center and individual data elements individually have a radius to the designated center.

A magnetic field generator (comprising magnetic coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control system 26 uses information stored in an internal database to process the detected MR signals in a coordinated manner to generate high quality images of a selected slice (or slices) of the body and adjusts other parameters of system 10. The stored information comprises, for example, predetermined pulse sequence and magnetic field gradient and strength data as well as data indicating timing, orientation, and spatial volume of gradient magnetic fields to be applied in imaging. Generated images may be presented on display 40. Computer 28 includes a graphical user interface (GUI) enabling user interaction with central controller 26 and enabling user modification of magnetic resonance imaging signals in substantially real time. Display processor 37 processes the magnetic resonance signals to provide image representative data for display on display 40, for example.

Generalized Auto-calibrating Partially Parallel Acquisitions (GRAPPA) is a parallel imaging reconstruction technique that addresses the missing lines of data resulting from increasing the acceleration factor associated with the MRI device. This strategy performs a coil-by-coil image reconstruction using a linear combination of k-space neighbors from all of the coils. There are a variety of implementations of the GRAPPA process that may be used with the techniques described herein. In some embodiments, the GRAPPA process may be generally summarized by the following steps. First, k-space data is under-sampled by an acceleration rate. Specifically, lines of k-space data spaced according to the acceleration rate are acquired, along with one or more additional calibration lines. Then, a linear combination of the acquired lines is determined such that the combination provides an optimal approximation to the calibration lines. Based on this linear combination, linear coefficients are identified. Next, the missing k-space data points are interpolated using these linear weights. Then, individual coil images are constructed. Finally, the coil images are combined to produce the full image. One notable benefit of GRAPPA is that it does not require computation of explicit coil sensitivities. Thus, GRAPPA is especially beneficial in applications where accurate coil sensitivity maps may be difficult to obtain (e.g., lung and abdominal MRI, real-time imaging, and single-shot EPI). However, because GRAPPA is based on mathematical interpolation, the distance between the lines of acquired data will correlate with the error involved with the interpolation. Specifically, as the distance between lines increases (i.e., from increasing the acceleration factor), the error grows.

Figure 2:
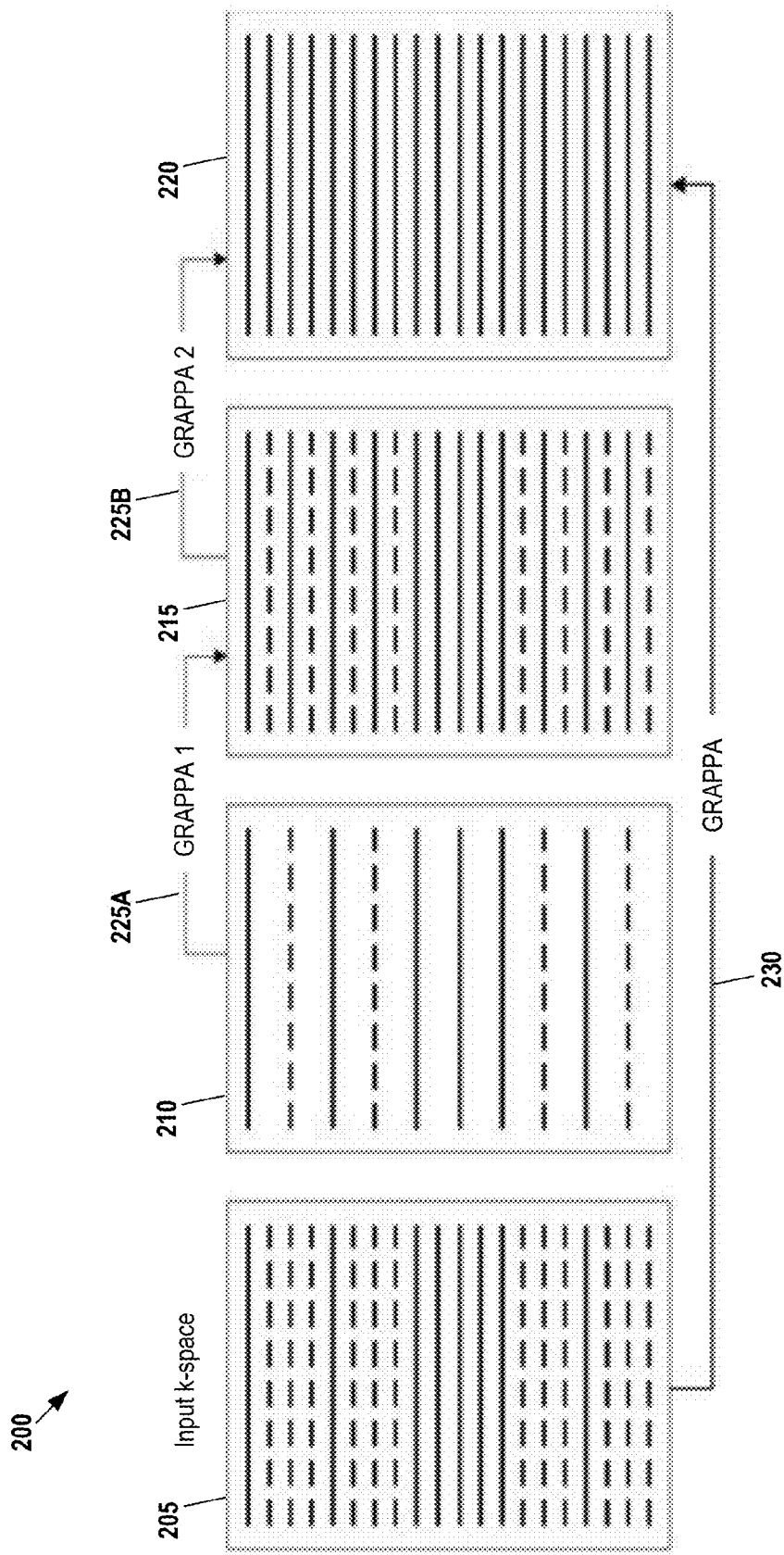
FIG. 2 provides an illustration of a multi-stage parallel imaging reconstruction process, according to some embodiments of the present invention.

FIG. 2 provides an illustration of a multi-stage parallel imaging reconstruction process 200, according to some embodiments of the present invention. In the example of FIG. 2, the fitting strategy applied at each stage is GRAPPA, however the general techniques described in the various embodiments of the present invention can also be applied to other similar fitting strategies. The multi-stage process 200 addresses the limitations of the general GRAPPA process for increased acceleration factors. Specifically, in this example, a two-stage process is used to address missing data resulting from an acceleration factor of 4. In FIG. 2, the bottom arrow 230 illustrates the conventional GRAPPA technique, while top arrows 225A and 225B illustrate stage one and two, respectively, of the two-stage process 200 as implemented in some embodiments of the present invention.

Continuing with reference to FIG. 2, the first plot 205 shows the k-space data that are under-sampled every 4 lines (i.e., an acceleration of 4). In plot 205, solid lines correspond to the acquired/filled data, while the dashed lines refer to missing data. The process 200 begins by filling in the odd lines missing from the acquired k-space data set. To illustrate the acquisition process, in the second plot 210, the even k-space lines (e.g., the second and fourth lines) of the first plot 205 are removed. Next, a fitting strategy (e.g., GRAPPA) is applied at 225A to fill in the odd lines, thereby yielding plot 215. Then, the fitting strategy is applied again at 225B to fill in the even lines missing on the first plot (e.g., the second and fourth lines), thereby yielding a complete k-space data set at plot 220.

The multi-stage parallel imaging reconstruction process described by the various embodiments herein can generally be extended to any parallel imaging application where the acceleration factor is a multiple of 2. The number of lines to be interpolated may be determined by subtracting 1 from the acceleration factor. For example, in applications where the acceleration factor is 4, 8, 16, 32, or 64, the number of lines that need to be interpolated will be 3, 7, 15, 31, or 63, respectively. Additional stages will be used, as necessary, to fully interpolate the information. For example, for an acceleration factor of 4, two stages of the reconstruction process may be used to yield a complete k-space data set. However, for an acceleration factor of 8, three stages may be needed for fully fill the k-space. As with any interpolation, increasing the number of lines that need to be interpolated will, in turn, increase the error in the final, interpolated result. Thus, in many embodiments, the multi-stage reconstruction process described herein is limited to acceleration factor values below a predetermined threshold value.

Figure 3:
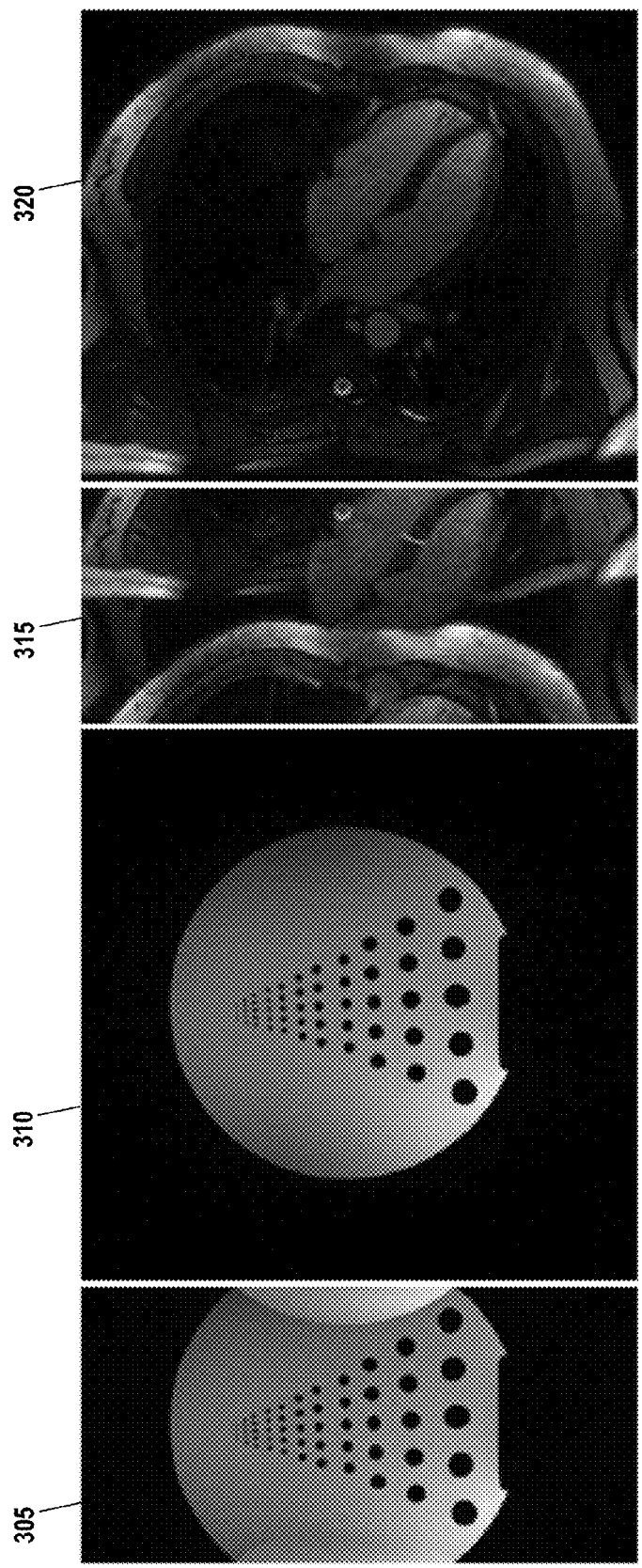
FIG. 3 provides a group of reconstructed images resulting from a multi-stage parallel imaging reconstruction process, as implemented by some embodiments of the invention described herein.

FIG. 3 provides a group of reconstructed images resulting from the multi-stage parallel imaging reconstruction process, as implemented by some embodiments of the invention described herein. In FIG. 3, a first stage is represented by images 305 and 315. These images are examples of reconstructed half field of view (FOV) images generated for an incomplete (e.g., undersampled) k-space data set. For example, the images 305 and 315 may correspond to an incomplete k-space data set generated after the odd lines have been filled in with a fitting strategy (e.g., plot 215 of FIG. 2). Images 310 and 320 are examples of images generated following a second stage of the reconstruction process. These images 310 and 320 may correspond, for example, to the reconstructed images after the even lines (e.g., of plot 215) are filled, recovering the full FOV (e.g., plot 220 of FIG. 2).

Figure 4:
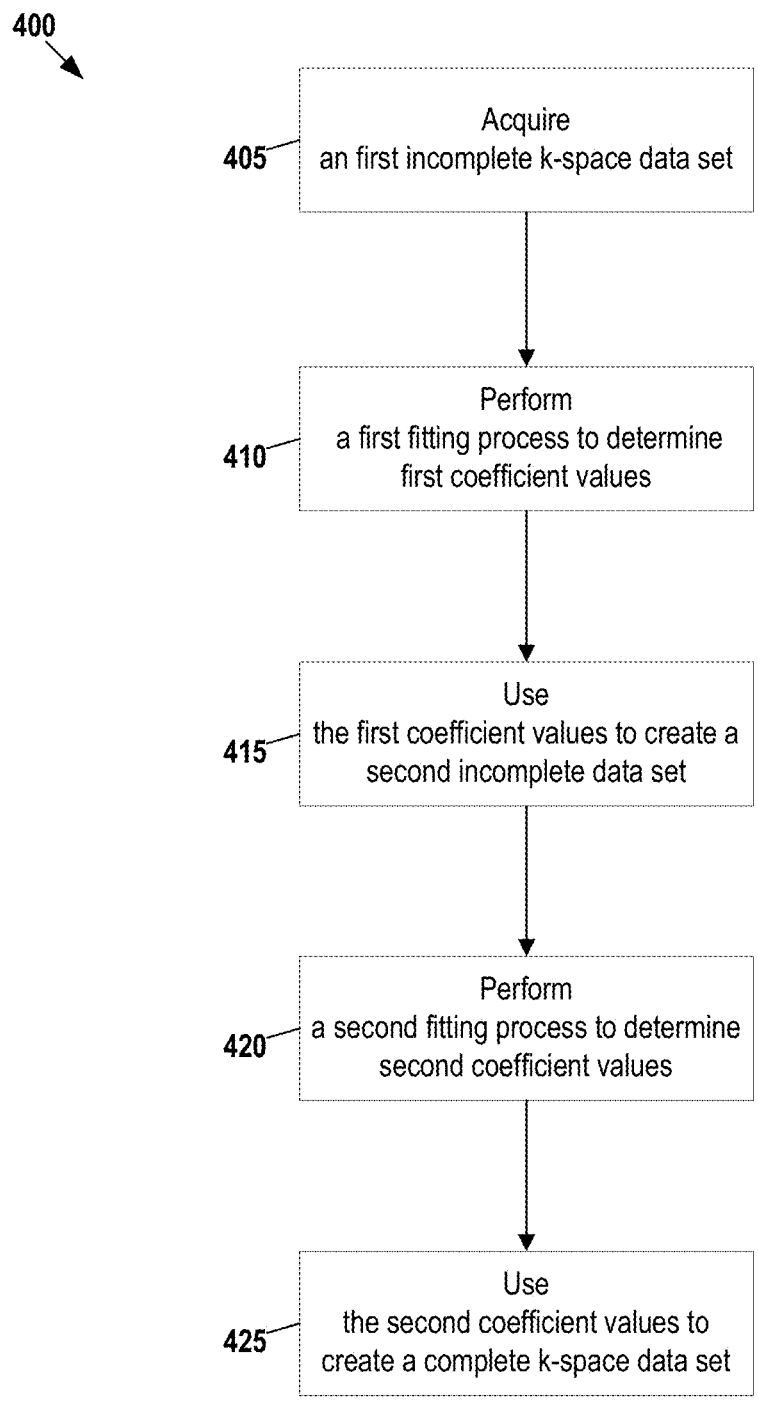
FIG. 4 provides an example implementation of a multi-stage parallel imaging reconstruction process, according to some embodiments of the present invention.

FIG. 4 provides a flow chart of an example implementing a multi-stage parallel imaging reconstruction process 400, according to some embodiments of the present invention. At 405, a magnetic resonance system (e.g., system 10 of FIG. 1) is used to acquire an incomplete (e.g., undersampled) k-space data set comprising a plurality of first k-space lines spaced according to an acceleration factor and one or more calibration lines. Next, at 410 a first fitting process is performed to determine a plurality of first coefficient values, as referred to as "weights." In one embodiment, this first fitting process comprises two steps. First, a linear combination of the first k-space lines providing a first optimal approximation of the one or more calibration lines is determined. Second, a plurality of first coefficient values associated with the first linear combination is determined. Various techniques known in the art may be used for the first fitting process. For example, in some embodiments, a matrix-based technique is used according to a formula wherein a source matrix of the known k-space lines is multiplied by the first coefficient values to yield a target matrix including the calibration lines. By inverting the source matrix and multiplying by the target matrix, the coefficient values may be determined. In other embodiments, other techniques such as summations are similarly used to determine the coefficients.

Continuing with reference to FIG. 4, at 415, the first coefficient values are used to determine a plurality of second k-space lines missing from the first incomplete k-space data set, thereby creating a second incomplete k-space data set. Then, at 420, a second fitting process is performed to calculate second coefficient values. In some embodiments, the second fitting process comprises two steps which are similar to the first fitting process described above. Specifically, a second linear combination of the first k-space lines and second k-space lines are determined. This second linear combination provides a second optimal approximation of the one or more calibration lines. Then, the plurality of second coefficient values associated with the second linear combination is determined. Finally, at 425, the second coefficient values are used to determine a plurality of third k-space lines missing from the second incomplete k-space data set, thereby creating a complete k-space data set.

The particular lines acquired in each step of the process 400 illustrated in FIG. 4 vary across different embodiments. For example, in one embodiment, the second k-space lines include the odd numbered lines between the first k-space lines and the third k-space lines include the even numbered lines between first k-space lines.

In some embodiments, the process 400 illustrated in FIG. 4 is executed across one or more RF coils. As a result, each coil will be associated with its own k-space data set. That is, the complete k-space data set described above with reference to FIG. 4 includes a group of coil-specific k-space data sets. Each coil-specific k-space data set corresponds to one of a plurality of magnetic resonance coils used in acquiring the incomplete k-space data set. An image may then be generated using each coil's k-space data set. For example, in one embodiment, a Fourier transform is applied to each coil-specific k-space data sets, to create a plurality of image components. Then, the image components are combined into a single image using a combination method such as, for example, a square root sum of squares method.

Figure 5:
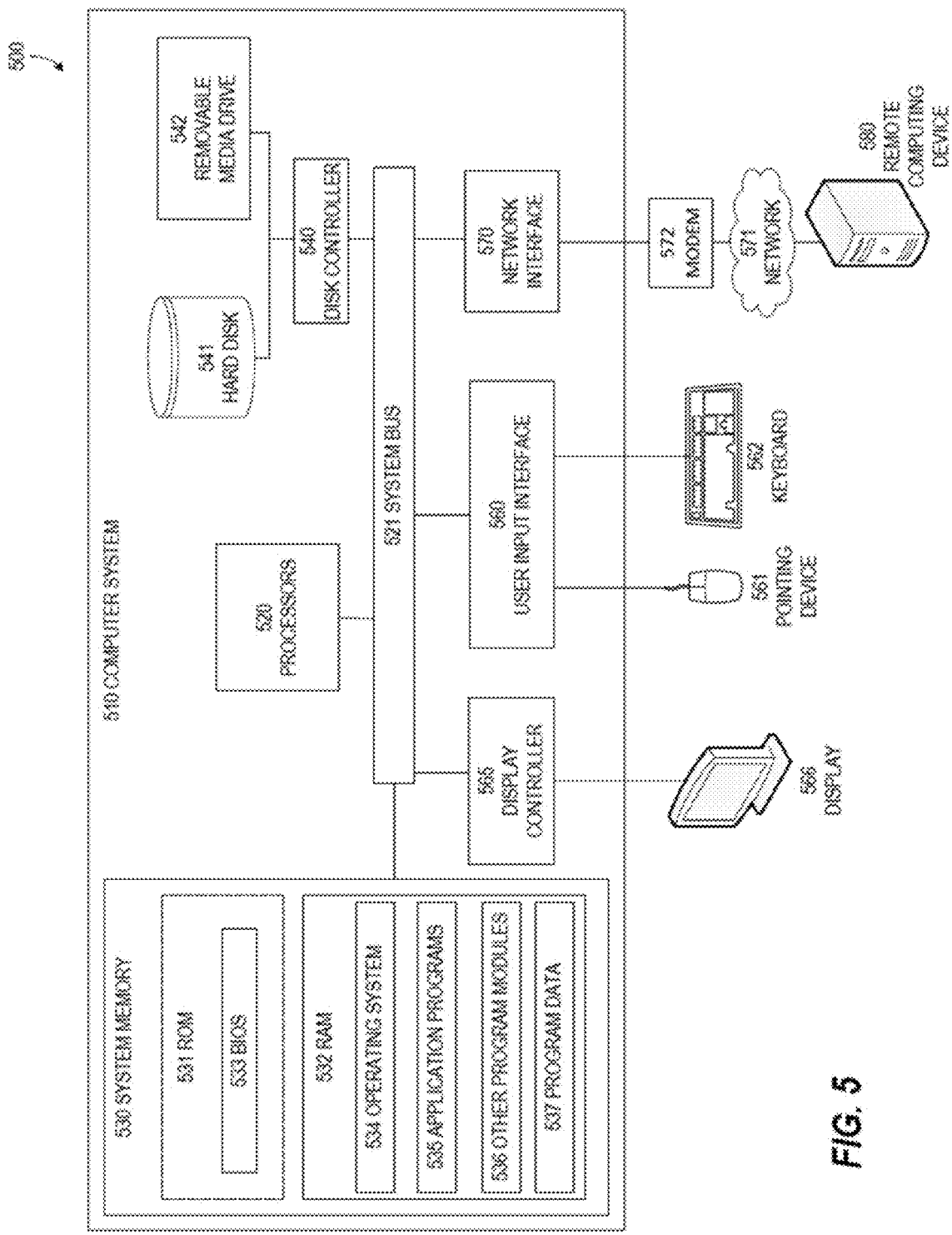
FIG. 5 illustrates an exemplary computing environment within which embodiments of the invention may be implemented.

FIG. 5 illustrates an exemplary computing environment 500 within which embodiments of the invention may be implemented. This environment 500 may be used, for example, as part of system 10 or in addition to system 10 illustrated in FIG. 1. Computing environment 500 may include computer system 510, which is one example of a computing system upon which embodiments of the invention may be implemented. Computers and computing environments, such as computer system 510 and computing environment 500, are known to those of skill in the art and thus are described briefly here.

As shown in FIG. 5, the computer system 510 may include a communication mechanism such as a bus 521 or other communication mechanism for communicating information within the computer system 510. The system 510 further includes one or more processors 520 coupled with the bus 521 for processing the information.

The processors 520 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 5, the computer system 510 also includes a system memory 530 coupled to the bus 521 for storing information and instructions to be executed by processors 520. The system memory 530 may include computer readable storage media in the form of volatile and/or nonvolatile memory, such as read only memory (ROM) 531 and/or random access memory (RAM) 532. The system memory RAM 532 may include other dynamic storage device(s) (e.g., dynamic RAM, static RAM, and synchronous DRAM). The system memory ROM 531 may include other static storage device(s) (e.g., programmable ROM, erasable PROM, and electrically erasable PROM). In addition, the system memory 530 may be used for storing temporary variables or other intermediate information during the execution of instructions by the processors 520. A basic input/output system 533 (BIOS) containing the basic routines that help to transfer information between elements within computer system 510, such as during start-up, may be stored in ROM 531. RAM 532 may contain data and/or program modules that are immediately accessible to and/or presently being operated on by the processors 520. System memory 530 may additionally include, for example, operating system 534, application programs 535, other program modules 536 and program data 537.

The computer system 510 also includes a disk controller 540 coupled to the bus 521 to control one or more storage devices for storing information and instructions, such as a magnetic hard disk 541 and a removable media drive 542 (e.g., floppy disk drive, compact disc drive, tape drive, and/or solid state drive). The storage devices may be added to the computer system 510 using an appropriate device interface (e.g., a small computer system interface (SCSI), integrated device electronics (IDE), Universal Serial Bus (USB), or FireWire).

The computer system 510 may also include a display controller 565 coupled to the bus 521 to control a display or monitor 565, such as a cathode ray tube (CRT) or liquid crystal display (LCD), for displaying information to a computer user. The computer system includes an input interface 560 and one or more input devices, such as a keyboard 561 and a pointing device 562, for interacting with a computer user and providing information to the processor 520. The pointing device 562, for example, may be a mouse, a light pen, a trackball, or a pointing stick for communicating direction information and command selections to the processor 520 and for controlling cursor movement on the display 566. The display 566 may provide a touch screen interface which allows input to supplement or replace the communication of direction information and command selections by the pointing device 561.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium, such as a hard disk 541 or a removable media drive 542. The hard disk 541 may contain one or more datastores and data files used by embodiments of the present invention. Datastore contents and data files may be encrypted to improve security. The processors 520 may also be employed in a multi-processing arrangement to execute the one or more sequences of instructions contained in system memory 530. In alternative embodiments, hard-wired circuitry may be used in place of or in combination with software instructions. Thus, embodiments are not limited to any specific combination of hardware circuitry and software.

As stated above, the computer system 510 may include at least one computer readable medium or memory for holding instructions programmed according embodiments of the invention and for containing data structures, tables, records, or other data described herein. The term "computer readable medium" as used herein refers to any medium that participates in providing instructions to the processor 520 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as hard disk 541 or removable media drive 542. Non-limiting examples of volatile media include dynamic memory, such as system memory 530. Non-limiting examples of transmission media include coaxial cables, copper wire, and fiber optics, including the wires that make up the bus 521. Transmission media may also take the form of acoustic or light waves, such as those generated during radio wave and infrared data communications.

The computing environment 500 may further include the computer system 520 operating in a networked environment using logical connections to one or more remote computers, such as remote computer 580. Remote computer 580 may be a personal computer (laptop or desktop), a mobile device, a server, a router, a network PC, a peer device or other common network node, and typically includes many or all of the elements described above relative to computer 510. When used in a networking environment, computer 510 may include modem 572 for establishing communications over a network 571, such as the Internet. Modem 572 may be connected to system bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computing system 580). The network 571 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the UI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A computer-implemented method for reconstruction of a magnetic resonance image, the method comprising:
    acquiring a first incomplete k-space data set comprising a plurality of first k-space lines spaced according to an acceleration factor and one or more calibration lines;
    applying, by an image data processor, a parallel imaging reconstruction technique to the first incomplete k-space data set to determine a plurality of second k-space lines not included in the first incomplete k-space data set, thereby yielding a second incomplete k-space data set which comprises the first incomplete k-space data set and the plurality of second k-space lines; and
    applying, by the image data processor, the parallel imaging reconstruction technique to the second incomplete k-space data set to determine a plurality of third k-space lines not included in the second incomplete k-space data set, thereby yielding a complete k-space data set which comprises the second incomplete k-space data set and the plurality of third k-space lines.

2. The method of claim 1, wherein the first incomplete k-space data set is under-sampled every 4 lines.

3. The method of claim 2, wherein each second k-space line is located between two first k-space lines.

4. The method of claim 3, wherein each third k-space line is located between a first k-space line and a second k-space line.

5. The method of claim 1, further comprising:
    applying a Fourier transform to the complete k-space data set to yield a reconstructed image; and
    displaying the reconstructed image in a graphical user interface.

6. The method of claim 1, wherein the parallel imaging reconstruction technique is Generalized Autocalibrating Partially Parallel Acquisition (GRAPPA).

7. The method of claim 1, wherein the first incomplete k-space data set comprises a half field of view (FOV) in a phase encoding direction.

8. The method of claim 1, wherein the plurality of second k-space lines comprise one or more odd numbered lines between the plurality of first k-space lines.

9. The method of claim 1, wherein the plurality of third k-space lines comprise one or more even numbered k-space lines between the plurality of first k-space lines.

10. A computer-implemented method for reconstruction of a magnetic resonance image, the method comprising:
    acquiring a first incomplete k-space data set comprising a plurality of first k-space lines spaced according to an acceleration factor and one or more calibration lines;
    performing, by an image data processor, a first fitting process comprising:
        determining a first linear combination of the first k-space lines providing a first optimal approximation of the one or more calibration lines, and
        determining a plurality of first coefficient values associated with the first linear combination;
        using the first coefficient values to determine a plurality of second k-space lines missing from the first incomplete k-space data set, thereby creating a second incomplete k-space data set;
    performing, by the image data processor, a second fitting process comprising:
        determining a second linear combination of the first k-space lines and the second k-space lines providing a second optimal approximation of the one or more calibration lines, and
        determining a plurality of second coefficient values associated with the second linear combination; and
        using the second coefficient values to determine a plurality of third k-space lines missing from the second incomplete k-space data set, thereby creating a complete k-space data set which comprises the second incomplete k-space data set and the plurality of third k-space lines.

11. The method of claim 10, wherein the complete k-space data set comprises a plurality of coil-specific k-space data sets, each coil-specific k-space data set corresponding to one of a plurality of magnetic resonance coils used in acquiring the first incomplete k-space data set.

12. The method of claim 11, further comprising:
    applying a Fourier transform to each coil-specific k-space data set, to create a plurality of image components; and
    combining the image components into a single image using a combination method.

13. The method of claim 12, wherein the combination method is a square root sum of squares method.

14. The method of claim 10, wherein the plurality of second k-space lines comprise one or more odd numbered lines between the plurality of first k-space lines.

15. The method of claim 14, wherein the plurality of third k-space lines comprise one or more even numbered lines between the plurality of first k-space lines.

16. A system for reconstruction of a magnetic resonance image, the system comprising:
    a plurality of magnetic resonance coils configured to acquire a first incomplete k-space data set comprising a plurality of first k-space lines spaced according to an acceleration factor and one or more calibration lines; and
    an image data processor configured to:
        apply a parallel imaging reconstruction technique to the first incomplete k-space data set to determine a plurality of second k-space lines not included in the first incomplete k-space data set, thereby yielding a second incomplete k-space data set, and
        apply the parallel imaging reconstruction technique to the second incomplete k-space data set to determine a plurality of third k-space lines not included in the second incomplete k-space data set, thereby yielding a complete k-space data set which comprises the second incomplete k-space data set and the plurality of third k-space lines.

17. The system of claim 16, wherein the complete k-space data set comprises a plurality of coil-specific k-space data sets, each coil-specific k-space data sets corresponding to one of the plurality of magnetic resonance coils.

18. The system of claim 17, wherein the image data processor is further configured to:
    applying a Fourier transform to each coil-specific k-space data sets, to create a plurality of image components; and
    combining the image components into a single image using a combination method.

19. The system of claim 18, further comprising:
    a graphical user interface configured to present the single image.

20. The system of claim 16, wherein the parallel imaging reconstruction technique is Generalized Autocalibrating Partially Parallel Acquisition (GRAPPA).

* * * * *